United States Patent
Han et al.

(10) Patent No.: US 8,564,317 B2
(45) Date of Patent: Oct. 22, 2013

(54) TEST SOCKET, AND TEST APPARATUS WITH TEST SOCKET TO CONTROL A TEMPERATURE OF AN OBJECT TO BE TESTED

(75) Inventors: Jong-Won Han, Cheonan-si (KR); Seok Goh, Cheonan-si (KR); Byoung-Jun Min, Asan-si (KR); Jung-Hyeon Kim, Hwaseong-si (KR); Sang-Sik Lee, Suwon-si (KR); Bo-Woo Kim, Suwon-si (KR); Ho-Jeong Choi, Yongin-si (KR)

(73) Assignee: SAMSUNG Electronics Co., Ltd., Suwon-si (KR)

(*) Notice: Subject to any disclaimer, the term of this patent is extended or adjusted under 35 U.S.C. 154(b) by 346 days.

(21) Appl. No.: 12/719,267

(22) Filed: Mar. 8, 2010

(65) Prior Publication Data

US 2010/0164525 A1 Jul. 1, 2010

Related U.S. Application Data

(63) Continuation of application No. 12/214,932, filed on Jun. 24, 2008, now abandoned.

(30) Foreign Application Priority Data

Jun. 30, 2009 (KR) .................. 10-2009-0058710
Jan. 18, 2010 (KR) .................. 10-2010-0004451

(51) Int. Cl.
*G01R 31/00* (2006.01)

(52) U.S. Cl.
USPC ............. 324/750.14; 324/750.01; 324/756.02

(58) Field of Classification Search
None
See application file for complete search history.

(56) References Cited

U.S. PATENT DOCUMENTS

| 6,445,203 B1 * | 9/2002 | Yamashita et al. ........ 324/750.08 |
| 2002/0109518 A1 * | 8/2002 | Saito et al. .................... 324/760 |
| 2009/0009204 A1 | 1/2009 | Lee et al. |

FOREIGN PATENT DOCUMENTS

| JP | 06-252296 | 9/1994 |
| JP | 2005-030829 | 2/2005 |
| KR | 2001-792 | 1/2001 |
| KR | 10-0392229 | 7/2003 |
| KR | 20-0334395 | 11/2003 |
| KR | 2007-70769 | 7/2007 |
| KR | 2009-2927 | 1/2009 |

* cited by examiner

*Primary Examiner* — Minh N Tang
(74) *Attorney, Agent, or Firm* — Stanzione & Kim, LLP

(57) ABSTRACT

A test socket is provided that includes a socket body to receive an object to be tested, a lid disposed on the socket body, one or more pushers coupled to a first surface of lid to apply force to a first surface of the object toward the socket body, and a temperature controlling member to provide a temperature to the object. A semiconductor package may be tested in a test apparatus that includes the test socket, the methods of testing including receiving a semiconductor package in a socket in a test chamber, applying a first temperature to the test chamber to test the semiconductor package at a first test temperature, and applying a second temperature to the semiconductor package to test the semiconductor package at a second test temperature by controlling the application of the second temperature with the socket.

13 Claims, 9 Drawing Sheets

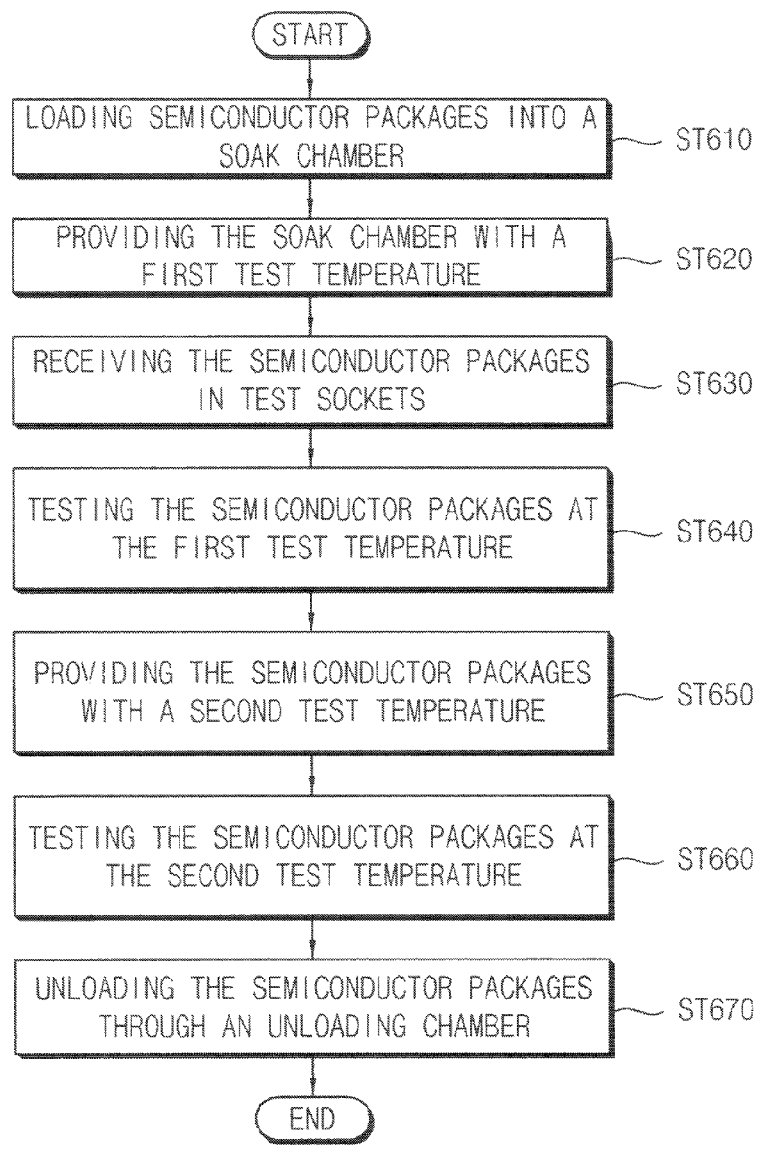

TEST SOCKET, AND TEST APPARATUS WITH TEST SOCKET TO CONTROL A TEMPERATURE OF AN OBJECT TO BE TESTED

CROSS-REFERENCE TO RELATED APPLICATIONS

This application claims priority under 35 USC §119 to Korean Patent Application Nos. 2009-58710, filed on Jun. 30, 2009 and 2010-4451, filed on Jan. 18, 2010 in the Korean Intellectual Property Office (KIPO), the contents of which are herein incorporated by reference in their entirety. This is a continuation of application Ser. No. 12/214,932, filed Jun. 24, 2008, now U.S. Patent Publication No. 2009/0009204 and abandoned, the contents of which are herein incorporated by reference in their entirety.

BACKGROUND

1. Field of the Invention

The present general inventive concept relates to test sockets, and more particularly, to a test socket, a test apparatus, and a method of testing electrical characteristics of a semiconductor package at one or more test temperatures.

2. Description of the Related Art

Generally, semiconductor processes are performed on a wafer to form a plurality of semiconductor chips. To mount the semiconductor chips on a printed circuit board (PCB), a packaging process is performed on the wafer to form semiconductor packages.

Electrical characteristics of the semiconductor package, which is manufactured by the above-mentioned processes, are tested. According to a conventional test method, the semiconductor package is loaded into a test chamber. The semiconductor package is held in a test socket. The semiconductor package in the test socket electrically makes contact with a test board. A test current is supplied to the semiconductor package through the test board to test the electrical characteristics of the semiconductor package.

Here, in order to test the electrical characteristics of the semiconductor package under various temperatures, the test process is carried out under the various temperatures. Thus, a separate temperature controller, which is located outside of the test chamber, provides hot or cold air to the test chamber to set the various temperatures in the test chamber. However, according to the conventional method, it takes a very long time to heat or cool the test chamber. Therefore, the test chamber reaches a desired test temperature only after a relatively long time of heating or cooling.

Further, the semiconductor package is indirectly provided with a desired test temperature using the air provided from outside of the test chamber. Thus, an inner temperature of the test chamber has a large deviation. As a result, the test process with respect to the semiconductor package is not performed under a desired accurate test temperature, so that the conventional test process may have a low reliability.

SUMMARY

Exemplary embodiments of the present general inventive concept provide a test socket, a test apparatus, and methods of testing a semiconductor package that rapidly and accurately sets one or more desired test temperatures at which the electrical characteristics of the semiconductor package are tested.

Additional features and utilities of the present general inventive concept will be set forth in part in the description which follows and, in part, will be obvious from the description, or may be learned by practice of the general inventive concept.

Exemplary embodiments of the present general inventive concept provide a test socket including a socket body, a thermoelectric element and a heat transfer member. The socket body receives an object. The thermoelectric element is arranged in the socket body to emit heat and absorb heat in accordance with current directions. The heat transfer member is arranged between the object and the thermoelectric element to transfer a heat generated from the object to the thermoelectric element.

The socket body may include a base and a lid. The object may be fixed to the base. The lid may be rotatably connected to the base to cover the base. Further, the thermoelectric element and the heat transfer member may be held by the lid.

The socket body may further include a latch rotatably connected to the lid to detachably fix the lid to the base.

The socket body may further include a locking spring configured to resiliently bias the latch toward the base.

The latch may have a holding protrusion selectively held in a holding groove formed at the base.

The lid may include a housing for movably receiving the heat transfer member.

The test socket may further include a contact spring to resiliently bias the heat transfer member toward the object such that there is an electrical contact between the heat transfer member and the object.

The test socket may further include a heat spreader contacting the thermoelectric element to dissipate the heat from the thermoelectric element.

Further, the heat spreader may have a plurality of protrusions that enlarge a heat radiation area of the heat spreader.

The test socket may further include a fan for sucking the heat of the thermoelectric element.

The object may comprise a semiconductor package.

The thermoelectric element may include first and second heat-emitting plates configured to emit the heat, a heat-absorbing plate electrically connected to the first and second heat-emitting plates to absorb the heat, and N-type and P-type semiconductor devices interposed between the heat-absorbing plate and the first and second heat-emitting plates.

Exemplary embodiments of the present general inventive concept may also provide a test socket including a base configured to hold an object, a lid rotatably connected to the base to cover the base, a latch rotatably connected to the lid to detachably fix the lid to the base, a locking spring configured to resiliently bias the latch toward the base, a thermoelectric element placed in the lid to emit heat and absorb heat by a current provided to the thermoelectric element, a heat transfer member arranged between the object and the thermoelectric element to transfer the heat in the object to the thermoelectric element, a heat spreader making contact with the thermoelectric element to dissipate the heat in the thermoelectric element, a contact spring installed at the heat spreader to resiliently bias the heat spreader, the thermoelectric element and the heat transfer member toward the object, and a fan arranged over the heat spreader to suck the heat in the heat spreader.

The latch may include a holding protrusion selectively inserted into a holding groove that is formed at the base.

The heat spreader may have a plurality of protrusions configured to enlarge a heat dissipation area of the heat spreader, and the contact spring may be wound on the holding protrusions.

Exemplary embodiments of the present general inventive concept may also provide a test socket including a socket body configured to receive a semiconductor package, a thermoelectric element placed in the socket body to emit heat and absorb heat by a current provided to the thermoelectric element, and a heat transfer member arranged between the semiconductor package and the thermoelectric element to transfer the heat in the semiconductor package to the thermoelectric element, a heat spreader making contact with the thermoelectric element to dissipate the heat in the thermoelectric element, and a fan arranged over the heat spreader to suck the heat in the heat spreader.

The heat spreader may have a plurality of protrusions configured to enlarge a heat dissipation area of the heat spreader.

The test socket may further comprise a contact spring configured to resiliently bias the heat spreader, the thermoelectric element and the heat transfer member toward the semiconductor package.

Exemplary embodiments of the present general inventive concept provide a test socket including a socket body to receive an object to be tested, a lid disposed on the socket body, one or more pushers coupled to a first surface of lid to apply force to a first surface of the object toward the socket body, and a temperature controlling member to provide a temperature to the object.

The test socket may include one or more suction members to draw air from the one or more channels to cool the object.

The one or more pushers of the test socket may include a surface to contact and apply the force to the first surface of the object.

The temperature controlling member of the test socket may be disposed at one end of the one or more pushers.

The test socket of claim may include one or more channels disposed on at least one surface of the temperature controlling member and extending parallel with an axis thereof through the temperature controlling member and the one or more pushers.

Exemplary embodiments of the present general inventive concept provide a test apparatus including one or more sockets to receive a respective object to be tested that is disposed in a test chamber and to control a temperature of the respective object received therein, a soak chamber disposed on one side of the test chamber, the soak chamber to receive objects to be tested and to provide a predetermined first temperature, an unloading chamber disposed on another side of the test chamber to unload and sort the tested objects, and a stocker disposed adjacent to at least one of the soak chamber, the test chamber, and the unloading chamber, the stocker to at least store the sorted objects.

The test apparatus may include a temperature controlling member to control the temperature of the soak chamber.

The test apparatus may include where at least the soak chamber and the test chamber are in fluidic communication with one another.

The one or more sockets of the test apparatus may include a lid disposed on the socket body, one or more pushers coupled to a first surface of lid to apply force to a first surface of the object toward the socket body, and a temperature controlling member to provide a temperature to the object.

The test apparatus may include one or more channels disposed on at least one surface of the temperature controlling member and extending parallel with an axis thereof.

The test apparatus may include one or more suction members to draw air from the one or more channels to cool the object.

The one or more pushers of the test apparatus may include a surface to contact and apply the force to the first surface of the object.

The test socket may include where the temperature controlling member is disposed at one end of the one or more pushers.

The test socket may include where the unloading chamber includes a sorting member to sort the tested objects into operable and non-operable groups.

Exemplary embodiments of the present general inventive concept provide a method of testing a semiconductor package, the method including loading the semiconductor package into a soak chamber, applying a first temperature to the soak chamber with a first temperature controlling member coupled to the soak chamber that is in fluidic communication with a test chamber, receiving a semiconductor package of a socket in the test chamber, testing the semiconductor package at the first test temperature, and applying a second temperature to the semiconductor package to test the semiconductor package at a second test temperature by controlling the application of the second temperature with the socket.

The testing the semiconductor package at the first test temperature of the method may include testing the electrical operation of the semiconductor package when the semiconductor package is at the first test temperature.

The method may include testing the electrical operation of the semiconductor package when the semiconductor package is at the second test temperature.

The method may include unloading the semiconductor package through an unloading chamber coupled to the test chamber.

The method may include determining whether the semiconductor device is operable after the first test temperature and the second test temperature, and sorting the semiconductor device into operable or non-operable groups.

The method may include unloading the semiconductor package through an unloading chamber, and stocking the sorted semiconductor devices in a stocker chamber into the operable and non-operable groups.

The applying the second test temperature of the method may include controlling the application of the second temperature to the semiconductor package with a temperature controlling member of the test socket.

Exemplary embodiments of the present general inventive concept provide a method of testing a semiconductor package, the method including loading the semiconductor package into a soak chamber, applying a first test temperature to the soak chamber, receiving the semiconductor package in a socket in the test chamber that is connected to the soak chamber such that the first temperature is applied to the test chamber, testing the semiconductor package received in a socket disposed in the test chamber when the test chamber is at the first temperature, the socket having a temperature controlling member that is not operated when a first test temperature is applied to the test chamber, and applying a second test temperature to the semiconductor package with a temperature controlling member in the socket to test the semiconductor package at the second test temperature.

The testing the semiconductor package of the method may include testing the electrical characteristics of the semiconductor device at the first test temperature and the second test temperature.

The method may include determining whether the semiconductor device is operable after the first test temperature and the second test temperature, and sorting the semiconductor device into an operable or non-operable group.

According to exemplary embodiments of the present general inventive concept, an object to be tested may be directly provided with a desired test temperature using the thermoelectric element. Thus, the desired test temperature may be set rapidly and accurately. Further, the heat transfer member interposed between the object and the thermoelectric element may quickly dissipate the heat in the object.

BRIEF DESCRIPTION OF THE DRAWINGS

These and/or other features and utilities of the present general inventive concept will become apparent and more readily appreciated from the following description of the embodiments, taken in conjunction with the accompanying drawings of which:

FIG. 13 illustrates a method of testing an object using the apparatus in FIG. 12 according to exemplary embodiments of the present general inventive concept.

DETAILED DESCRIPTION OF THE EMBODIMENTS

Figure 1:
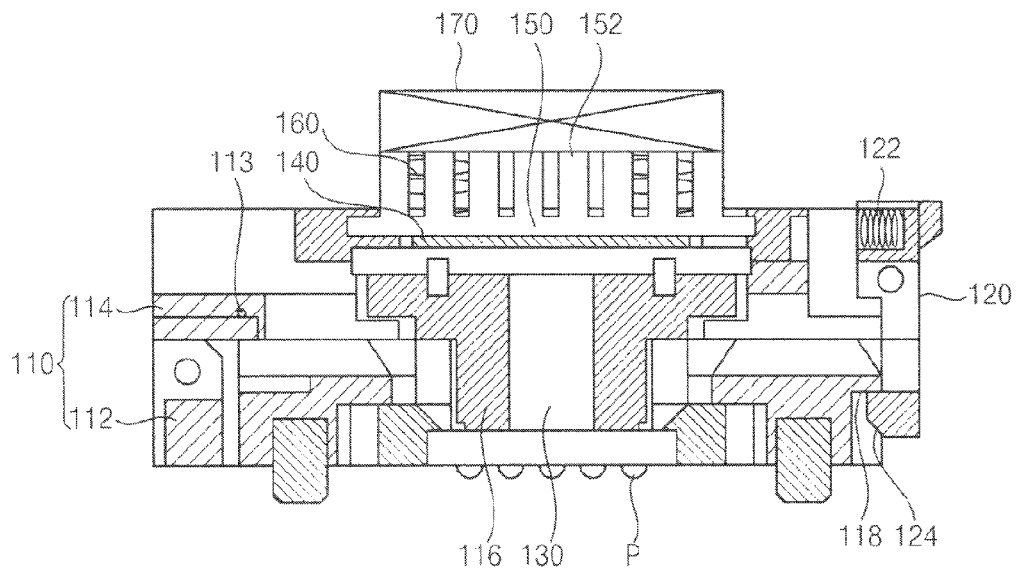
FIG. 1 is a cross-sectional view illustrating a test socket in accordance with exemplary embodiments of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 2:
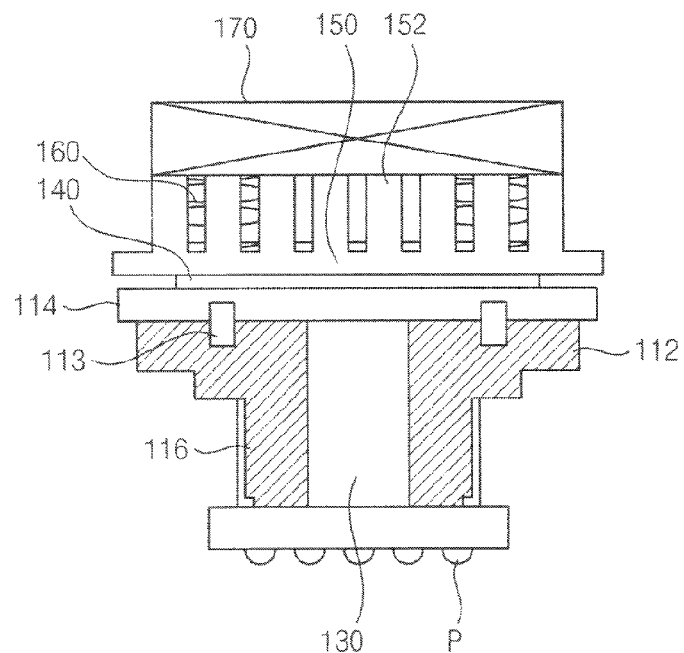
FIG. 2 is a side view illustrating the test socket in FIG. 1.
Figure 3:
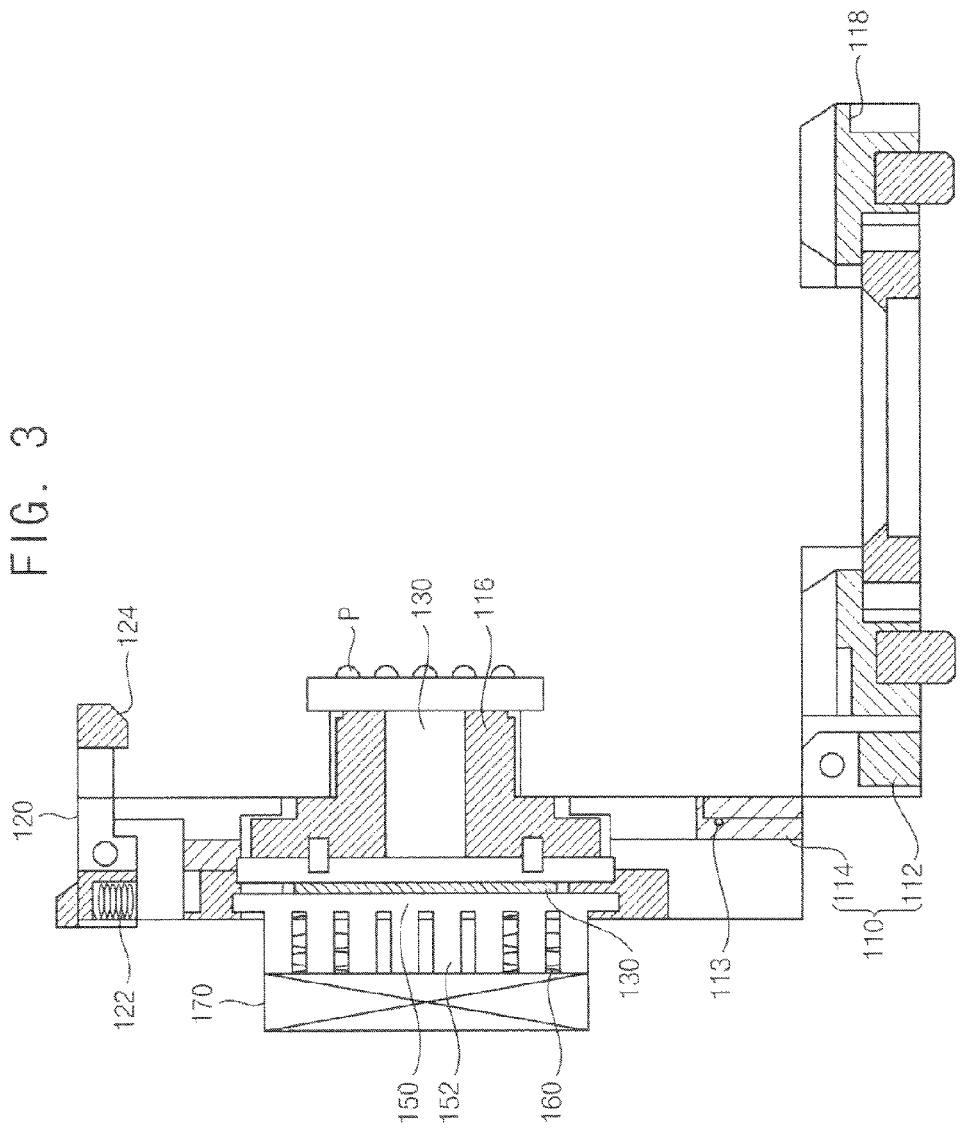
FIG. 3 is a cross-sectional view illustrating the test socket in FIG. 1 in which a lid is opened.
Figure 4:
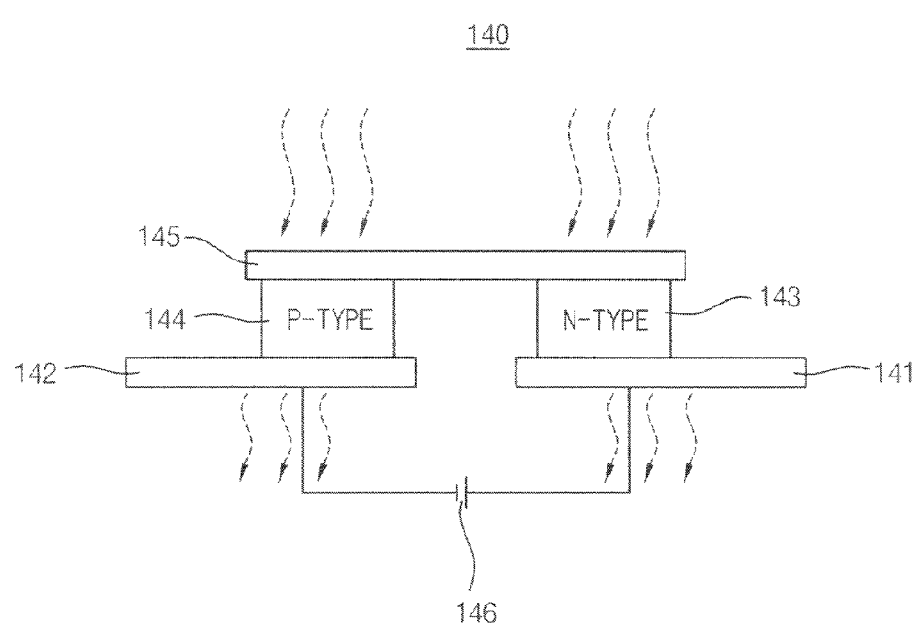
FIG. 4 is a cross-sectional view illustrating a thermoelectric element of the test socket in FIG. 1.
Figure 5:
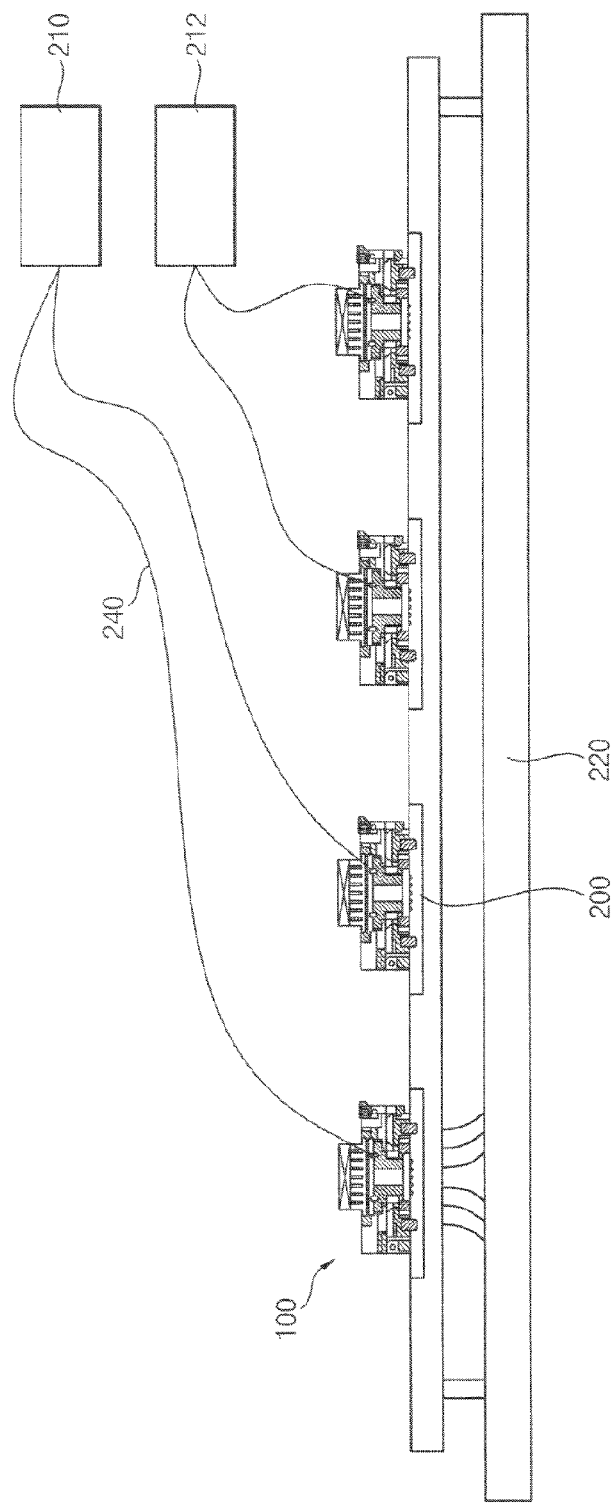
FIG. 5 is a cross-sectional view illustrating a method of testing semiconductor packages using the test sockets in FIG. 1 under various test temperatures according to exemplary embodiments of the present general inventive concept.

FIG. 1 is a cross-sectional view illustrating an example embodiment of a test socket in accordance with exemplary embodiments of the present general inventive concept, FIG. 2 is a side view illustrating the test socket in FIG. 1, FIG. 3 is a cross-sectional view illustrating the test socket in FIG. 1 in which a lid is opened, FIG. 4 is a cross-sectional view illustrating a thermoelectric element of the test socket in FIG. 1, and FIG. 5 is a cross-sectional view illustrating a method of testing semiconductor packages using the test sockets in FIG. 1 under one or more test temperatures.

Referring to FIGS. 1 and 2, a test socket 100 of the present general inventive concept includes a socket body 110, a heat transfer member 130, a thermoelectric element 140, a heat spreader 150, a contact spring 160, and a fan 170.

The socket body 110 includes a base 112 and a lid 114. The base 112 may receive an object whose electrical characteristics are to be tested, such as a semiconductor package P. The base 112 is placed on a test board 200 (see FIG. 5) to supply a test current to the semiconductor package P. That is, the test current may be supplied to the semiconductor package P from the test board 200 to test the electrical characteristics of the semiconductor package P.

The lid 114 covers the base 112. In exemplary embodiments of the present general inventive concept, a left portion of the lid 114 may be rotatably connected to the base 112 via a hinge pin 113. Thus, as shown in FIG. 1, the lid 114 may rotate in a clockwise direction and cover the base 112. The lid 114 may also rotate in a counterclockwise direction to open the base 112.

A latch 120 is rotatably connected to a right portion of the lid 114. The latch 120 detachably secures the lid 114 to the base 112. A holding protrusion 124 is formed at an end of the latch 120. The holding protrusion 124 is inserted into a holding groove 118, which is formed at a right face of the base 112. That is, the holding protrusion 124 is held in the holding groove 118. Further, a locking spring 118 is wound on a hinged portion of the latch 120 to resiliently support the latch 120 in the clockwise direction. Thus, since the holding protrusion 124 in the holding groove 118 may be resiliently supported by the locking spring 122 toward an inner direction of the holding groove 118, the holding protrusion 124 is not detached from the holding groove 118 under a condition that an external force is not applied to the latch 120. As a result, the lid 114 fixed to the base 112 may be maintained by the latch 120.

A housing 116 is installed at a central portion of the lid 114. The housing 116 has a hole vertically formed through the housing 116. Further, an upper surface of the semiconductor package P may be supported by a lower face of the housing 116.

The heat transfer member 130 is movably inserted into the hole of the housing 116. The heat transfer member 130 has a lower end making contact with the upper surface of the semiconductor package P. Thus, a heat generated from the semiconductor package P in the test process may be rapidly transferred to the heat transfer member 130. In example embodiments of the present general inventive concept, the heat transfer member 130 may include a material having high heat conductivity such as gold, copper, aluminum, etc.

The thermoelectric element 140 is located on the heat transfer member 130. The thermoelectric element 140 may provide the semiconductor package P with one or more temperatures during, for example, a test of the semiconductor package P. The thermoelectric element 140 makes contact with an upper surface of the heat transfer member 130. Therefore, the heat in the semiconductor package P may be quickly transferred to the thermoelectric element through the heat transfer member 130. The thermoelectric element 140 may be capable of emitting heat and absorbing heat by the current provided to the thermoelectric element 140 in accordance with Peltier effect.

Referring to FIG. 4, the thermoelectric element 140 includes first and second heat-emitting plates 141 and 142, a heat-absorbing plate 145 opposite to the first and second heat-emitting plates 141 and 142, and N type and P type semiconductor devices 143 and 144 interposed between the heat-absorbing plate 145 and the first and second heat-emitting plates 141 and 142. A power supply 146 is electrically connected to the first and second heat-emitting plates 141 and 142.

A current is provided to the first heat-emitting plate 141 from the power supply 146. The current flows to the second heat-emitting plate 142 through the N type semiconductor device 143, the heat-absorbing plate 145 and the P type semiconductor device 144. Thus, the first and second heat-emitting plates 141 and 142 emit heat. The heat-absorbing plate 145 absorbs heat. In contrast, when a current is provided to the second heat-emitting plate 142 from the power supply 146, the current flows to the first heat-emitting plate 141 through the P type semiconductor device 144, the heat-absorbing plate 145 and the N type semiconductor device 143. Thus, the first and second heat-emitting plates 141 and 142 absorb heat. The heat-absorbing plate 145 emits heat. This is due to the well-known Peltier effect.

The Peltier effect may be explained as a principle that an ideal gas is cooled by a constant entropy expansion. When an electron moves from a semiconductor having a high electron concentration to a semiconductor having a low electron concentration, an electron gas expands and then works with respect to a potential barrier between two plates having a substantially similar chemical potential, thereby electrically cooling an object.

Referring again to FIGS. 1 and 2, the heat spreader 150 is installed on an upper surface of the thermoelectric element 140. Thus, the heat spreader 150 makes contact with the upper surface of the thermoelectric element 140 to rapidly dissipate the heat transferred to the thermoelectric element 140 from the semiconductor package P. Additionally, since heat dissipation effect is proportional to a heat dissipation area, the heat spreader 150 may have a plurality of protrusions 152 to enlarge the heat dissipation area. In example embodiments of the present general inventive concept, the protrusions 152 may be vertically formed from an upper surface of the heat spreader 150.

The contact springs 160 are wound on outer faces of the protrusions 152, respectively. The contact springs 160 resiliently bias the heat spreader 150, the thermoelectric element 140 and the heat transfer member 130 toward a downward direction such that there is contact between the heat transfer member 130 and the semiconductor package P.

The fan 170 is arranged on the heat spreader 150. The fan 170 sucks the heat transferred from the semiconductor package P to the heat spreader 150 to more rapidly dissipate the heat to the outside. The fan 170 may be connected to the contact springs 160. Thus, the contact springs 160 may resiliently support the fan 170.

Referring to FIGS. 1 and 3, the semiconductor package P is secured on the lower surface of the housing 116. When the lid 114 is rotated clockwise with respect to the hinge pin 113, the lid 114 covers the base 112. Here, the holding protrusion 124 is inserted into the holding groove 118. Further, since the locking spring 122 resiliently biases the holding protrusion 124 toward the inner space of the holding groove 118, the holding protrusion 124 is not detached from the holding groove 118.

Referring to FIG. 5, a plurality of the semiconductor packages P may be tested using a plurality of the test sockets 100 under various test temperatures. The semiconductor packages P may make contact with upper surfaces of the test boards 200. The semiconductor packages P and the test boards 200 may be electrically coupled to each other. The test boards 200 may be positioned on table of a tester 220. The test sockets 100 may be selectively connected to a first power supply 210 for a high temperature (e.g., a first temperature) and a second power supply 212 for a low temperature (e.g., a second temperature) through cables 240. Thus, the semiconductor packages P in the test sockets 100 may be provided with different test temperatures. The electrical test process of the semiconductor packages P may be performed simultaneously under a high temperature and a low temperature. Accordingly, a test time may be remarkably decreased.

After the semiconductor packages P are tested, an upper portion of the latch 120 is rotated counterclockwise. The latch 120 compresses the locking spring 122. Thus, the holding protrusion 124 is detached from the holding groove 118. As a result, as shown in FIG. 3, the lid 114 is rotated counterclockwise to open the base 112. The semiconductor packages P are then unloaded from the lid 114.

In example embodiments of the present general inventive concept, the object may include the semiconductor package. Alternatively, the test socket may be applied to other electronic devices as well as the semiconductor package. Some tests in accordance with the example embodiments of the present general inventive concept were performed, as discussed below.

Testing Temperature of Test Socket
Cooling Test

A first temperature sensor was attached to the semiconductor package. A second temperature sensor was attached to the heat spreader. Nine voltages were applied to the thermoelectric element. Further, 12 voltages were applied to the fan. Temperatures of the semiconductor package and the heat spreader were measured six times at intervals of ten minutes.

The measured temperatures of the semiconductor package and the heat spreader using the first temperature sensor and the second temperature sensor are shown in a following table 1.

TABLE 1

| Minute | Temperature of semiconductor package | Temperature of heat spreader |
|---|---|---|
| 0 | 29.6° C. | 27.3° C. |
| 10 | −16.0° C. | 37.1° C. |
| 20 | −20.2° C. | 36.9° C. |
| 30 | −20.8° C. | 36.8° C. |
| 40 | −20.5° C. | 37.0° C. |
| 50 | −21.0° C. | 36.2° C. |
| 60 | −20.9° C. | 36.0° C. |

As shown in Table 1, an initial temperature of the semiconductor package is 29.6° C. and an initial temperature of the heat spreader is 27.3° C. Temperatures of the semiconductor package and the heat spreader measured after 20 minutes are −20.2° C. and 36.9° C., respectively. Temperatures of the semiconductor package and the heat spreader are still maintained after 60 minutes. Thus, according to the exemplary embodiments, it may be noted that a desired cooling temperature may be rapidly set using the test socket of the present general inventive concept. Further, it may be noted that the desired cooling temperature may be maintained continuously and constantly.

Heating Test

A first temperature sensor was attached to the semiconductor package, and a second temperature sensor was attached to the heat spreader. A polarity of the thermoelectric element in the cooling test was reversed. Nine voltages were applied to the thermoelectric element. Further, 12 voltages were applied to the fan. Temperatures of the semiconductor package and the heat spreader were measured after ten minutes.

The measured temperatures of the semiconductor package and the heat spreader using the first temperature sensor and the second temperature sensor are shown in a following table 2.

TABLE 2

| Minute | Temperature of semiconductor package | Temperature of heat spreader |
|---|---|---|
| 0 | 28.1° C. | 25.9° C. |
| 10 | 150.0° C. | 29.0° C. |

As shown in Table 2, an initial temperature of the semiconductor package is 28.1° C. and an initial temperature of the heat spreader is 25.9° C. Temperatures of the semiconductor package and the heat spreader measured after 10 minutes are 150.0° C. and 29.0° C., respectively. Thus, according to the exemplary embodiments, it may be noted that a desired heating temperature may be rapidly set using the test socket of the present general inventive concept.

Figure 6:
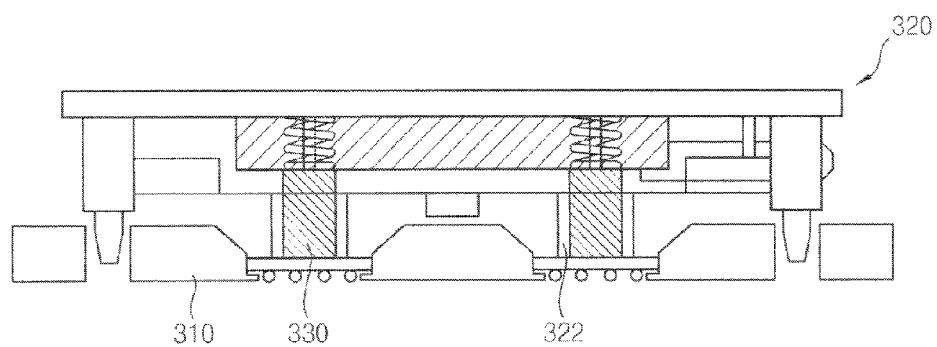
FIG. 6 is a cross-sectional view illustrating a test socket in accordance with example embodiments of the present general inventive concept.
Figure 7:
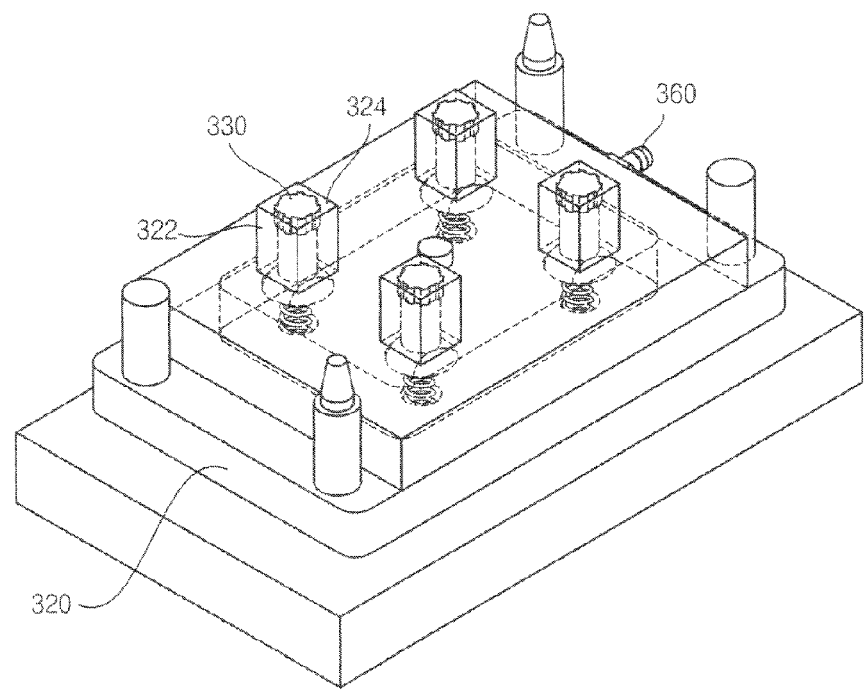
FIG. 7 is a perspective view illustrating a lid of the test socket in FIG. 6.
Figure 8:
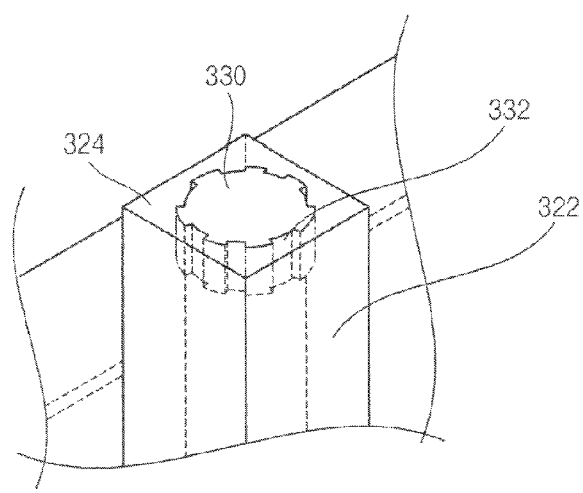
FIG. 8 is an enlarged perspective view illustrating a temperature controlling member of the lid in FIG. 6.

FIG. 6 is a cross-sectional view illustrating a test socket in accordance with example embodiments of the present general inventive concept, FIG. 7 is a perspective view illustrating a lid of the test socket in FIG. 6, and FIG. 8 is an enlarge perspective view illustrating a temperature controlling member of the lid in FIG. 7.

Referring to FIG. 6, a test socket 300 according to exemplary embodiments of the present general inventive concept may include a socket body 310, a lid 320 and a temperature controlling member 330.

The socket body 310 may have a structure to receive an object such as a semiconductor package. The socket body 310 may supply a test current to the object.

The lid 320 may be positioned over the socket body 310. The lid 320 may apply a pressure or force to the object toward the socket body 310 such that there is an electrical contact between the object and the socket body 310.

Referring to FIGS. 6 and 7, the lid 320 may have a plurality of pushers 322. The pushers 322 may make contact with the object. The pushers 322 may apply a pressure and/or a force to the object toward the socket body 310. Each of the pushers 322 may have a pressurizing face 324 to directly contact the object. The pushers 322 may include an adiabatic material.

The temperature controlling member 330 may be attached to the lid 320, or may be integrally formed with the lid 320. The temperature controlling member 330 may provide the object with one or more test temperatures. The temperature controlling member 330 may be coupled to or integrally formed on one end of one or more of the pushers 322. For example, one or more selected pushers may have a temperature controlling member 330 disposed at one end, or each pusher may have a temperature controlling member 330 disposed at one end. The one or more temperature controlling members 330 may be selectively operated to provide a test temperature to the object, or, alternatively, each of the temper controlling members 330 may be operated to provide a test temperature to the object to be tested. The temperature controlling member 330 may be exposed through the pressurizing face 324. Thus, the temperature controlling member 330 protruding through each pusher may directly make contact with the object.

The temperature controlling member 330 may include a cylindrical heating block. The heating block of the temperature controlling member 330 may provide the object with the test temperature by conduction within a predetermined time interval (e.g., in several seconds).

Referring to FIG. 8, in order to rapidly cool the object, which may be heated by the heating block of the temperature controlling member 330, to an environmental temperature of the test socket 300, cooling passageways 332 may be provided to the heating block of the temperature controlling member 330. The cooling passageways 332 may be formed on a circumferential surface of the temperature controlling member 330 along an axial direction of the heating block 330. Alternatively, the temperature controlling member 330 may include a cooling block to cool the object to a selected temperature.

Additionally, a suction 360 (see FIG. 7) may be connected to each of the pushers 322. The suction 360 may suck a cooling air in the cooling passageways 332 to cool the object. Alternatively, the suction 360 may suck the air from the passageways 332 to remove warm air near the object to cool the object.

Figure 9:
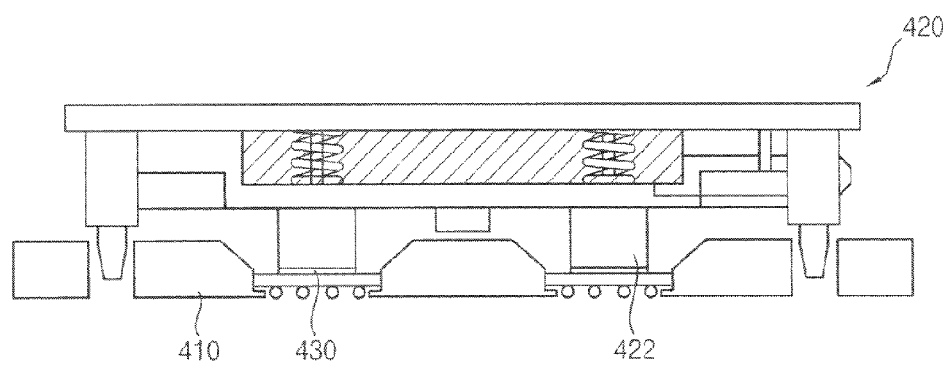
FIG. 9 is a cross-sectional view illustrating a test socket in accordance with example embodiments of the present general inventive concept.
Figure 10:
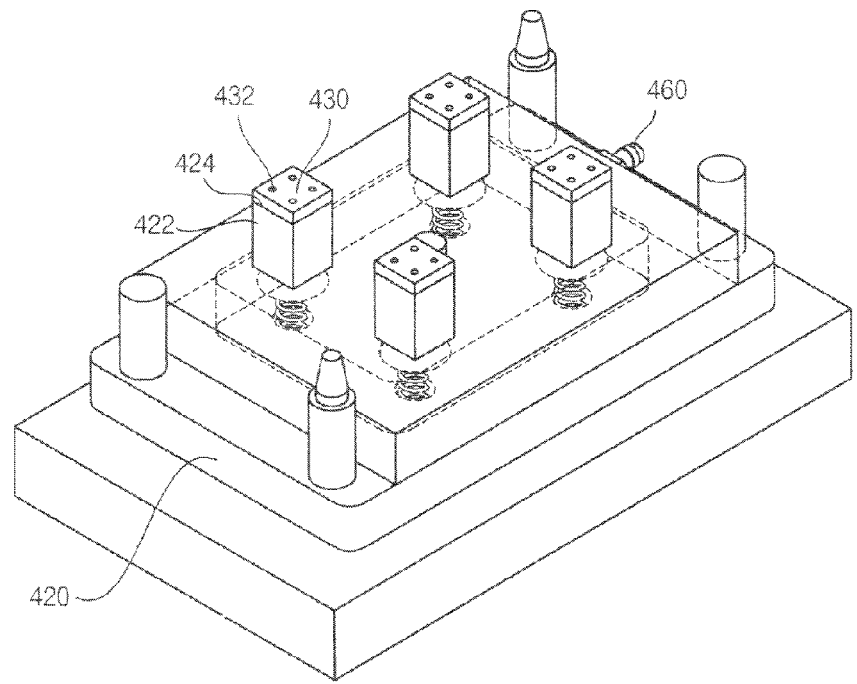
FIG. 10 is a perspective view illustrating a lid of the test socket in FIG. 9.
Figure 11:
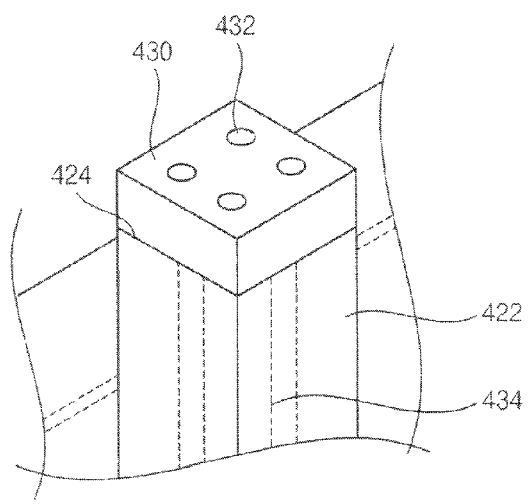
FIG. 11 is an enlarged perspective view illustrating a temperature controlling member of the lid in FIG. 10.

FIG. 9 is a cross-sectional view illustrating a test socket in accordance with example embodiments of the present general inventive concept, FIG. 10 is a perspective view illustrating a lid of the test socket in FIG. 9, and FIG. 11 is an enlarged perspective view illustrating a temperature controlling member of the lid in FIG. 10.

Referring to FIGS. 9 and 10, a test socket 400 may include a socket body 410, a lid 420 and a temperature controlling member 430.

The temperature controlling member 430 may be attached to a pressurizing face 424 of the pusher 422. The temperature controlling member 430 may include a thin heating plate. The heating plate of the temperature controlling member 430 may include an IR (infra-red) heater, a thermoelectric heater, or any other suitable heater which will perform the intended purposes as described herein. A cable 434 (e.g., as illustrated in FIG. 11) may be connected to the heating plate 430. The cable 434 may be connected to a controller and/or power supply to control the operation of the heating plate 430.

Referring to FIG. 11, cooling passageways 432 may be provided to the temperature controlling member 430. The cooling passageways 432 may be formed through at least the temperature controlling member 430. A suction 460 may be connected to each of the pushers 422. The suction 460 may suck a cooling air in the cooling passageways 432 to cool the object. Alternatively, the suction 460 may suck the air from the passageways 432 to remove warm air near the object to cool the object.

Apparatus to Test an Object

Figure 12:
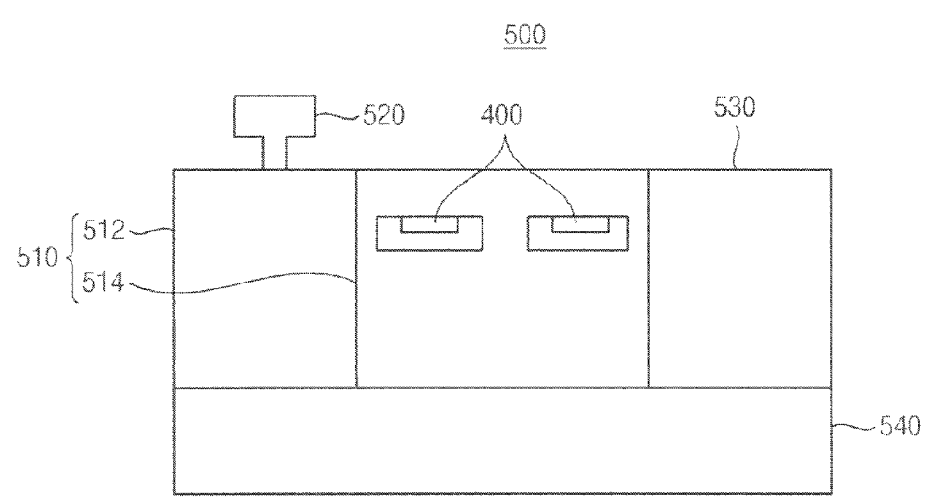
FIG. 12 is a cross-sectional view illustrating an apparatus to test an object in accordance with example embodiments of the present general inventive concept.

FIG. 12 is a cross-sectional view illustrating an apparatus to test an object in accordance with example embodiments of the present general inventive concept.

Referring to FIG. 12, an apparatus 500 may include a test handler 510, a first temperature controlling member 520 and test sockets 400.

The test handler 510 may include a soak chamber 512 and a test chamber 514. The soak chamber 512 and the test chamber 514 may be in fluidic communication with each other. Thus, the soak chamber 512 and the test chamber 514 may be provided with substantially the same temperature, for example, by the first temperature controlling member 520.

The test handler 510 may include a stocker 540 and an unloading chamber 530. The unloading chamber 530 may be connected with the test chamber 514. The stocker 540 may be located at sides of the soak chamber 512, the test chamber 514 and the unloading chamber 530. The stocker 540 may be connected with at least the soak chamber 512 and/or the unloading chamber 530.

The first temperature controlling member 520 may be connected to the soak chamber 512. The first temperature controlling member 520 may provide the soak chamber 512 with a first test temperature. For example, the first temperature controlling member 520 may provide the soak chamber 512 with a first test temperature by convection. The first temperature controlling member 520 may include a cooling member to supply a cooling air into the soak chamber 512. For example, the first temperature controlling member 520 may provide the soak chamber 512 with a low test temperature of about −5° C. in a low temperature test of a semiconductor package. Other exemplary low test temperatures may include, for example, about −10° C., −15° C., −20° C., and −25° C., or any other suitable temperature between about 0° C. and −25° C. Because the soak chamber 512 may be in fluidic communication with the test chamber 514, the test chamber 514 may also be provided with the low test temperature (e.g., −5° C. or any other suitable temperature that will perform the intended purposes described herein).

The test sockets 400 may be arranged in the test chamber 514. The test sockets 400 may selectively provide the semiconductor packages with a high test temperature of about 85° C., or any other suitable temperature from about 50° C. to 100° C. For example, temperature controlling member 430 (of test socket 400 illustrated in FIG. 9) may selectively provide a semiconductor package that is received in one or more of the test sockets 400 with a test temperature.

When the low temperature test may be performed on the semiconductor packages (e.g., the semiconductor packages in the soak chamber 512 and/or the test chamber 514), the test sockets 400 may not be operated so as to maintain the low test temperature of the semiconductor packages. That is, the temperature controlling member 430 of the test socket 400 may not be operated during the low temperature test. The semiconductor packages may be tested at the low test temperature provided by, for example, the first temperature controlling member 520.

When the low temperature test may be performed on one semiconductor package and the high temperature test may be performed on the same package or another semiconductor package, any one of the test sockets 400 may be operated to provide a semiconductor package with the high test temperature. That is, the test socket 400 may provide a semiconductor package with one or more test temperatures. For example, temperature controlling member 430 of test socket 400 illustrated in FIG. 9 may selectively provide a semiconductor package that is received in one or more of the test sockets 400 with one or more test temperatures, including a high test temperature.

When the high temperature test may be performed on the semiconductor packages, the test sockets 400 may be operated to provide the semiconductor packages with the high test temperature, or any other suitable test temperature.

The test sockets 400 may rapidly heat and cool the semiconductor packages for a predetermined period of time (e.g., for several seconds). Thus, the high temperature test and the low temperature test, or any other suitable test of the semiconductor packages at a plurality of test temperatures, may be performed in the single test chamber 514 without the need for transferring of the semiconductor packages to another test chamber. In other words, a plurality of test temperatures can be applied to a semiconductor package placed in the single test chamber 514, without any need for transporting the semiconductor package from one chamber to another.

Here, the temperature controlling member 430 of the test socket 400 in FIG. 9 may correspond to a second temperature controlling member in the apparatus 500. When the second temperature controlling member 430 may include a heating member, the second test temperature may be higher than the first test temperature. In contrast, when the first temperature controlling member 520 may include a heating member and the second temperature controlling member 430 may include a cooling member, the second test temperature may be lower than the first test temperature. Alternatively, the temperature controlling member 430 may include a heating member and a cooling member, so as to raise or lower a temperature accordingly for a temperature test. The first temperature controlling member may also include a heating member and a cooling member, so as to raise or lower a temperature accordingly for a temperature test.

Method of Testing an Object

FIG. 13 is a flow chart illustrating a method of testing an object using the apparatus in FIG. 12.

Referring to FIGS. 12 and 13, in operation ST610, the semiconductor packages in the stocker 540 may be loaded into the soak chamber 512. The stocker 540 may have one or more trays and/or bins to store one or more semiconductor packages that are to be tested.

In operation ST620, the first test temperature controller 520 may provide the soak chamber 512 with the first test temperature (e.g., a low test temperature). The test chamber 514 may also be provided with the first test temperature, as the soak chamber 512 and the test chamber 514 may be in fluidic communication with one another.

In operation ST630, the semiconductor packages may be transferred to the test chamber 514. The semiconductor packages may then be received in the test sockets 400.

In operation ST640, a test current may be supplied to the semiconductor packages through the test sockets 400 to test electrical characteristics of the semiconductor packages at the first test temperature (e.g., low test temperature).

In operation ST650, the second temperature controlling members 430 in the test sockets 400 may be operated to provide the semiconductor packages in the test sockets 400 with the second test temperature (e.g., a high test temperature). That is, the second test temperature may be applied to the semiconductor package (e.g., high temperature test may be performed) in the test chamber 514 where the first test temperature is applied to the semiconductor package (e.g., where the low temperature test may be performed).

In operation ST660, a test current may be supplied to the semiconductor packages through the test sockets 400 to test electrical characteristics of the semiconductor packages at the second test temperature (e.g., high test temperature).

Here, in this example, the tests at the first test temperature and the second test temperature (e.g., high temperature test and the low temperature test) may be performed on the semiconductor packages. According to example embodiments of the present general inventive concept, the first test temperature (e.g., low temperature test) may be applied to one or more semiconductor packages and the second temperature test (e.g., high temperature test) may be applied to a selected one or more semiconductor packages, which may include one or more of the semiconductor packages that the first test temperature was applied to. In this case, a test socket 400 in which the semiconductor package may be received may be operated to provide only the semiconductor package in the operated test socket 400 with the second test temperature. As described above, a heating time from the low test temperature to the high test temperature may be for a predetermined period of time (e.g., several seconds). Thus, the second temperature test (e.g., high temperature test) may be performed simultaneously with the first temperature test (e.g., low temperature test). That is, the high temperature test and the low temperature test may be simultaneously performed in the single test chamber 514. Alternatively, the first temperature test and the second temperature test can be performed at different times in the single test chamber 514.

In operation ST670, after completing the tests, the semiconductor packages may be unloaded from the test chamber 514 through the unloading chamber 530. The unloaded semiconductor packages may also be sorted in the unloading chamber 530. For example, the semiconductor packages may be sorted according to whether the semiconductor packages are determined to be operational after one or more of the temperature tests. That is, non-operational semiconductor packages may be sorted from operational semiconductor packages. The unloaded semiconductor packages may be stored in the stocker 540. The stocker 540 may include one or more bins or trays, where, for example, different bins and/or trays may hold the sorted semiconductor packages. That is, the operational semiconductor packages may be placed on one or more trays, and any non-operational semiconductor packages may be placed on one or more different trays. These bins and/or trays to store the sorted semiconductor packages may be different bins and/or trays that store the semiconductor packages to be tested.

According to example embodiments of the present general inventive concept, an object to be tested may be heated and/or cooled by the conduction. Thus, a time for providing the object with the test temperature may be greatly minimized. Further, the high test temperature test and the low test temperature test, or a plurality of temperature tests at different temperatures, may be performed in the single test chamber. As such, a test time of the object may be remarkably reduced.

Although several embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A test socket, comprising:
a socket body to receive an object to be tested;
a lid disposed on the socket body;
one or more pushers coupled to a first surface of lid to apply force to a first surface of the object toward the socket body; and
a temperature controlling member disposed at one end of the one or more pushers to be selectively operated when the temperature controlling member is in physical contact with the object so as to directly provide a temperature to the object.

2. The test socket of claim 1, further comprising:
one or more channels disposed on at least one surface of the temperature controlling member and extending parallel with an axis thereof.

3. The test socket of claim 2, further comprising:
one or more suction members to draw air from the one or more channels to cool the object.

4. The test socket of claim 1, wherein the one or more pushers further comprise:
a surface to contact and apply the force to the first surface of the object.

5. The test socket of claim 1, further comprising:
one or more channels disposed on at least one surface of the temperature controlling member and extending parallel with an axis thereof through the temperature controlling member and the one or more pushers.

6. A test apparatus, comprising:
one or more sockets to receive a respective object to be tested that is disposed in a test chamber, the one or more sockets including:
a lid disposed on a socket body;
one or more pushers coupled to a first surface of a lid to apply force to a first surface of the object toward the socket body; and
a temperature controlling member disposed at one end of the one or more pushers to be selectively operated provide a temperature to the object when the temperature controlling member in physical contact with the object so as to directly provide a temperature to the object;
a soak chamber disposed on one side of the test chamber, the soak chamber to receive objects to be tested;
an unloading chamber disposed on another side of the test chamber to unload and sort the tested objects; and
a stocker disposed adjacent to at least one of the soak chamber, the test chamber, and the unloading chamber, the stocker to at least store the sorted objects.

7. The test apparatus of claim 6, further comprising:
a second temperature controlling member to control a temperature of the soak chamber.

8. The test apparatus of claim 7, wherein at least the soak chamber and the test chamber are in fluidic communication with one another.

9. The test apparatus of claim 6, further comprising:
one or more channels disposed on at least one surface of the temperature controlling member and extending parallel with an axis thereof.

10. The test apparatus of claim 6, further comprising:
one or more suction members to draw air from the one or more channels to cool the object.

11. The test apparatus of claim 6, wherein the one or more pushers further comprise:
a surface to contact and apply the force to the first surface of the object.

12. The test apparatus of claim 6, wherein the temperature controlling member is configured to make contact with the object to directly provide the temperature to the object.

13. The test socket of claim 6, wherein the unloading chamber includes a sorting member to sort the tested objects into operable and non-operable groups.

* * * * *